(12) United States Patent
Khlat et al.

(10) Patent No.: US 7,078,966 B2
(45) Date of Patent: Jul. 18, 2006

(54) POWER AMPLIFIER SATURATION DETECTION AND OPERATION AT MAXIMUM POWER

(75) Inventors: Nadim Khlat, Cugnaux (FR); Jacques Trichet, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 10/977,832

(22) Filed: Oct. 29, 2004

(65) Prior Publication Data

US 2005/0093625 A1 May 5, 2005

(30) Foreign Application Priority Data

Oct. 31, 2003 (EP) .................................. 03292727

(51) Int. Cl.
*H03G 3/20* (2006.01)
(52) U.S. Cl. ........................ 330/129; 330/291; 330/278
(58) Field of Classification Search ................ 330/129, 330/278, 279, 291
See application file for complete search history.

(56) References Cited

U.S. PATENT DOCUMENTS 5,150,075 A * 9/1992 Hietala et al. ............... 330/279
5,278,994 A 1/1994 Black
5,589,796 A * 12/1996 Alberth et al. ............... 330/133
5,606,285 A 2/1997 Wang
6,057,732 A 5/2000 Morishita
6,430,402 B1 8/2002 Agahi-Kesheh
6,476,677 B1 11/2002 Komaili
6,734,729 B1 * 5/2004 Andrys et al. ............... 330/129
6,781,452 B1 * 8/2004 Cioffi et al. .................. 330/10
6,982,594 B1 * 1/2006 Snider et al. ................ 330/140

* cited by examiner

*Primary Examiner*—Patricia Nguyen

(57) ABSTRACT

Power amplifier apparatus comprising a power amplifier (1) having a signal output, and a power control feedback loop (3, 4, 5) for controlling the output signal power relative to a first power target signal (8). A saturation control loop (6, 7) is responsive to a parameter indicative of saturation of the power amplifier (1) for adjusting the output signal power to a level at which the power amplifier means is substantially not saturated. A power target variation module (11, 15, 16) operable when the first power target signal (8) is at or close to a value corresponding to saturation of the power amplifier means (1) applies to the power control loop (3 to 7) a modified power target signal (17) corresponding to a power target higher than the first power target signal (8) and at which the power amplifier means (1) saturates. The modified power target signal (17) causes the saturation control loop (6, 7) to react to saturation of the power amplifier means (1) adjusting the output signal power to a level at which the power amplifier means (1) operates substantially at its maximum power but not saturated.

14 Claims, 3 Drawing Sheets

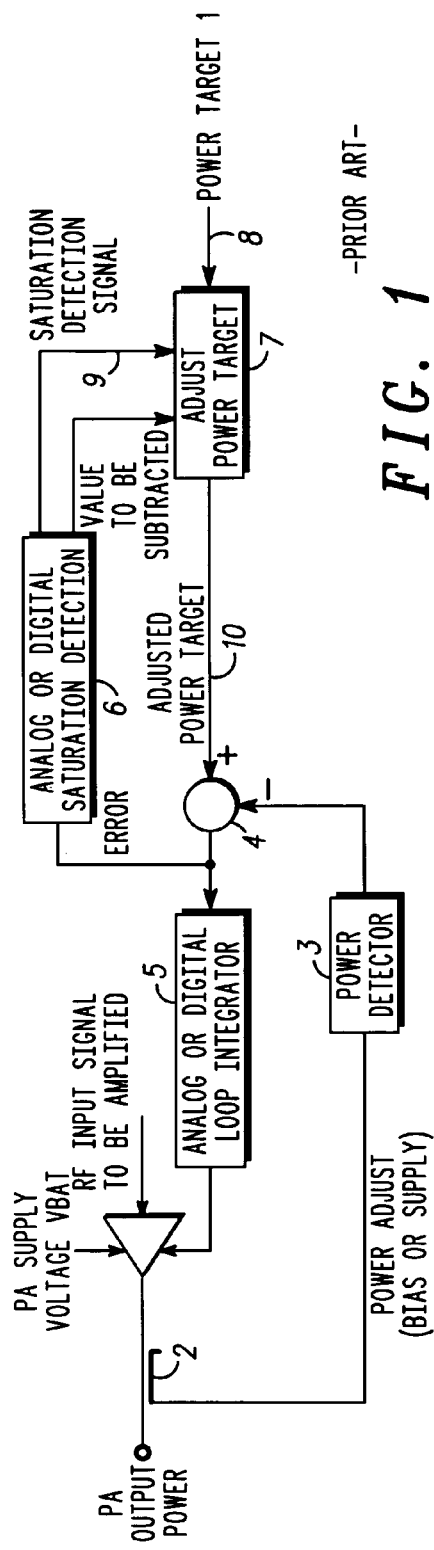
*FIG. 1* —PRIOR ART—
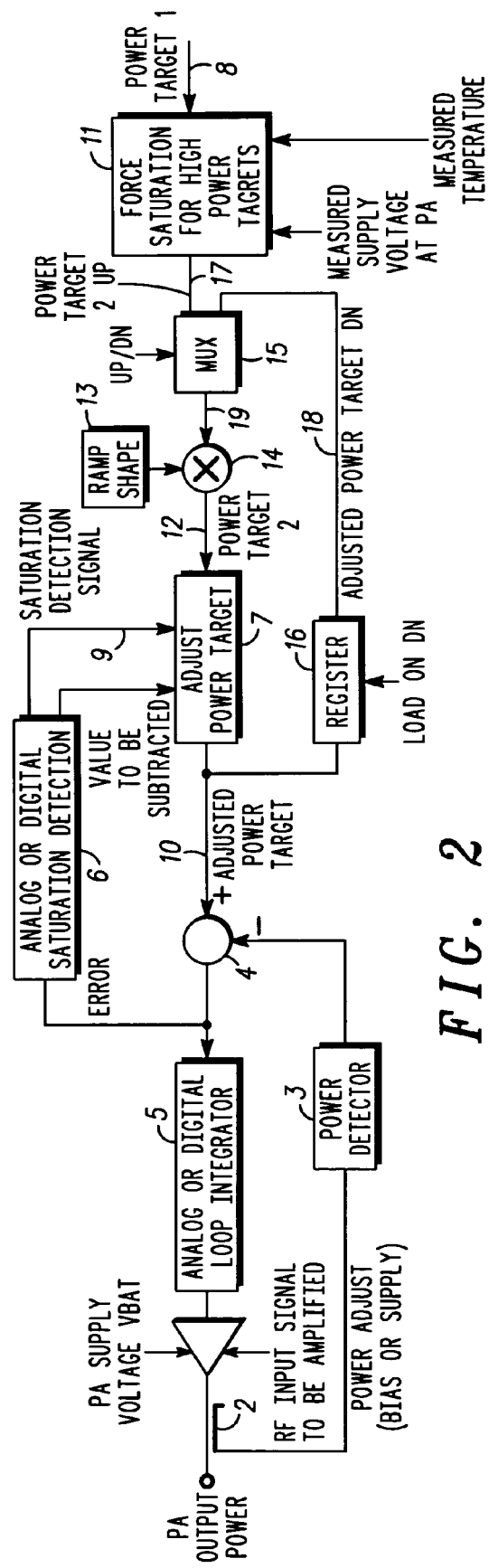
*FIG. 2*

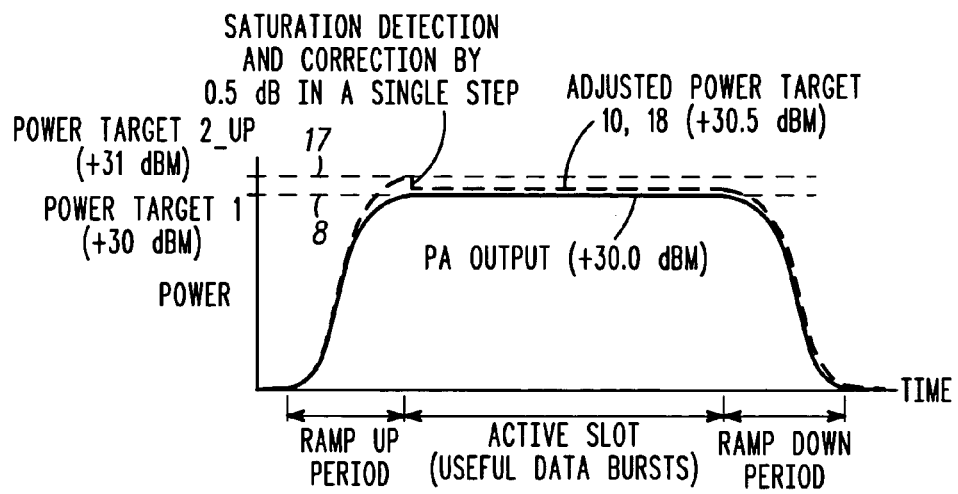
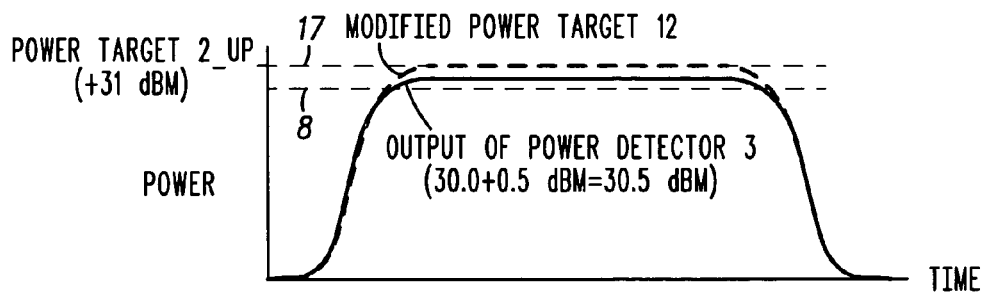
FIG. 3
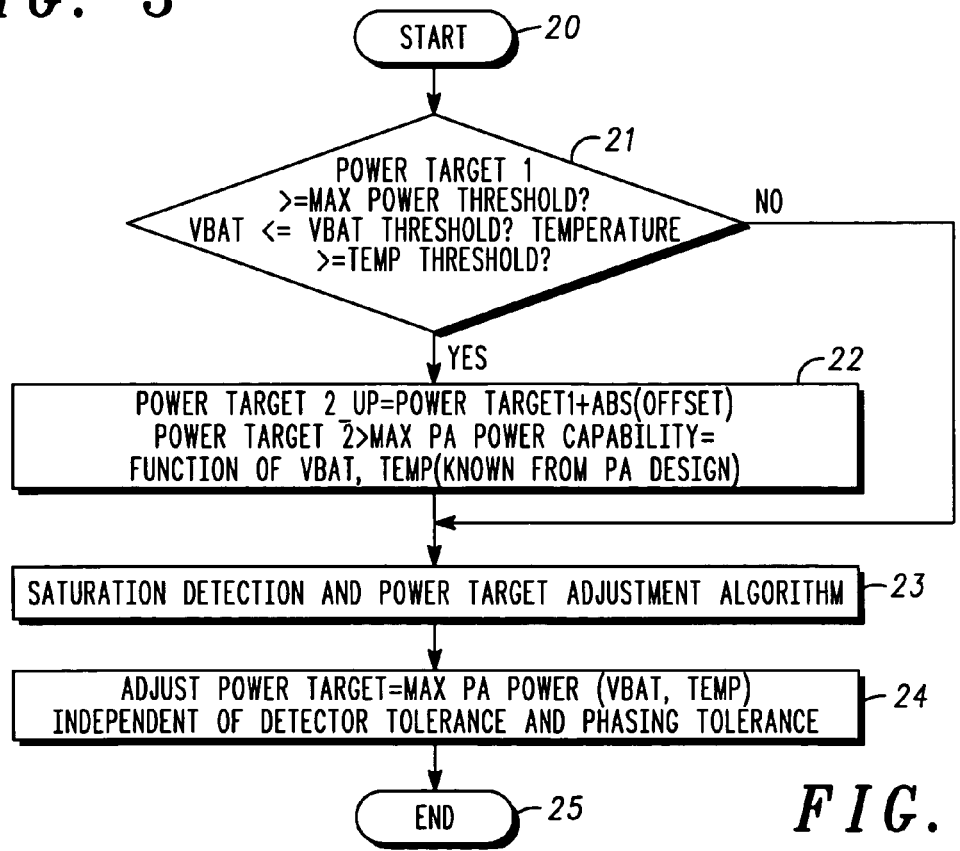
FIG. 4

POWER AMPLIFIER SATURATION DETECTION AND OPERATION AT MAXIMUM POWER

FIELD OF THE INVENTION

This invention relates to power amplifier saturation detection and more particularly to the effect of component tolerances and variability on the maximum output power available from the power amplifier.

BACKGROUND OF THE INVENTION

Power amplifiers are widely used, especially in radio communication applications, for example, but also in many other applications. The specifications for such power amplifiers often require the amplifier to be capable of producing at least a minimum output power level even in adverse circumstances of high ambient temperature and low battery charge.

Typically, such power amplifiers include a feedback loop for the power control of the amplifier that includes a detector responsive to the power of the amplifier output signal; the feedback loop compares the detector response with a received power target, in the form of a first power target signal, and controls the output power to a corresponding level.

Problems arise in some situations when the power amplifier output reaches a value at which the amplifier is saturated, that is to say that the amplifier is operating at maximum power and cannot increase further its output power in response to the power target. A particular problem of this kind arises in the case of certain cellular telephone systems, such as the Global System for Mobile Communications ("GSM") or the third generation telephone systems ("3GPP"), for example that users time division multiple access ("TDMA") communication protocols. Such protocols include time slots allocated to the user terminals; during the allocated time slot, the power amplifier of the user terminal is required to ramp up to the power indicated by the power target, send the desired signal, and ramp down to a much lower power level so as not to interfere with users sharing the same frequency in other time slots. The standard specifications for the protocols include a time mask and a spectral frequency mask which the terminals must meet. These specifications require a smooth ramp-up of the power amplifier output under strict time constraints.

Not only does saturation of the power amplifier risk impacting the efficiency and quality of operation of the power amplifier, but also the saturated power amplifier may take an excessive time to ramp down its power.

U.S. Pat. No. 5,278,994 provides a response to this problem. The amplifier controller detects saturation of the amplifier, by responding to a parameter such as lack of reaction of the amplifier output to the power target, in the form of a feedback error signal that does not diminish, and adjusts the output signal power to a level at which the power amplifier is substantially not saturated, that is to say that the power amplifier operates at or close to its maximum power without being saturated.

If all components of the feedback loop had perfect characteristics, with no manufacturing tolerances and no variability in operation, this system would be very satisfactory. However, in practice, the production test equipment itself has tolerances which cause variability of the power detector response and the power detector response varies in addition with temperature and frequency. The order of magnitude of the production tolerances and of the variability of response with temperature and frequency (typically of the order of 0.5 dB in each case) are significant. In particular, in order to meet the minimum output power requirements of the specifications referred to above, the power amplifier is oversized typically, that is to say has a maximum output power greater than that required by the specification, in order to ensure that even with unfavourable variance of the detector response, the power amplifier will still be capable of delivering the specification minimum output power.

This oversizing of the power amplifier penalises the talktime, that is to say the accumulative length of time during which the user terminal can operate transmitting and receiving content before the battery needs recharging, and represents a cost penalty also.

There is a requirement for a power amplifier system which reduces or avoids such oversizing.

SUMMARY OF THE INVENTION

The present invention provides a as described in the accompanying claims.

BRIEF DESCRIPTION OF THE DRAWINGS

FIG. 1 is a schematic diagram of a known type of power amplifier system which may be adapted to the present invention, FIG. 2 is a schematic diagram of a power amplifier system in accordance with one embodiment of the invention, given by way of example FIG. 3 is a graphical representation of signals appearing in operation of the amplifier system of FIG. 2, and FIG. 4 and FIG. 5 are flow charts of operations of the amplifier system of FIG. 2.

DETAILED DESCRIPTION OF THE PREFERRED EMBODIMENTS

Figure 5:
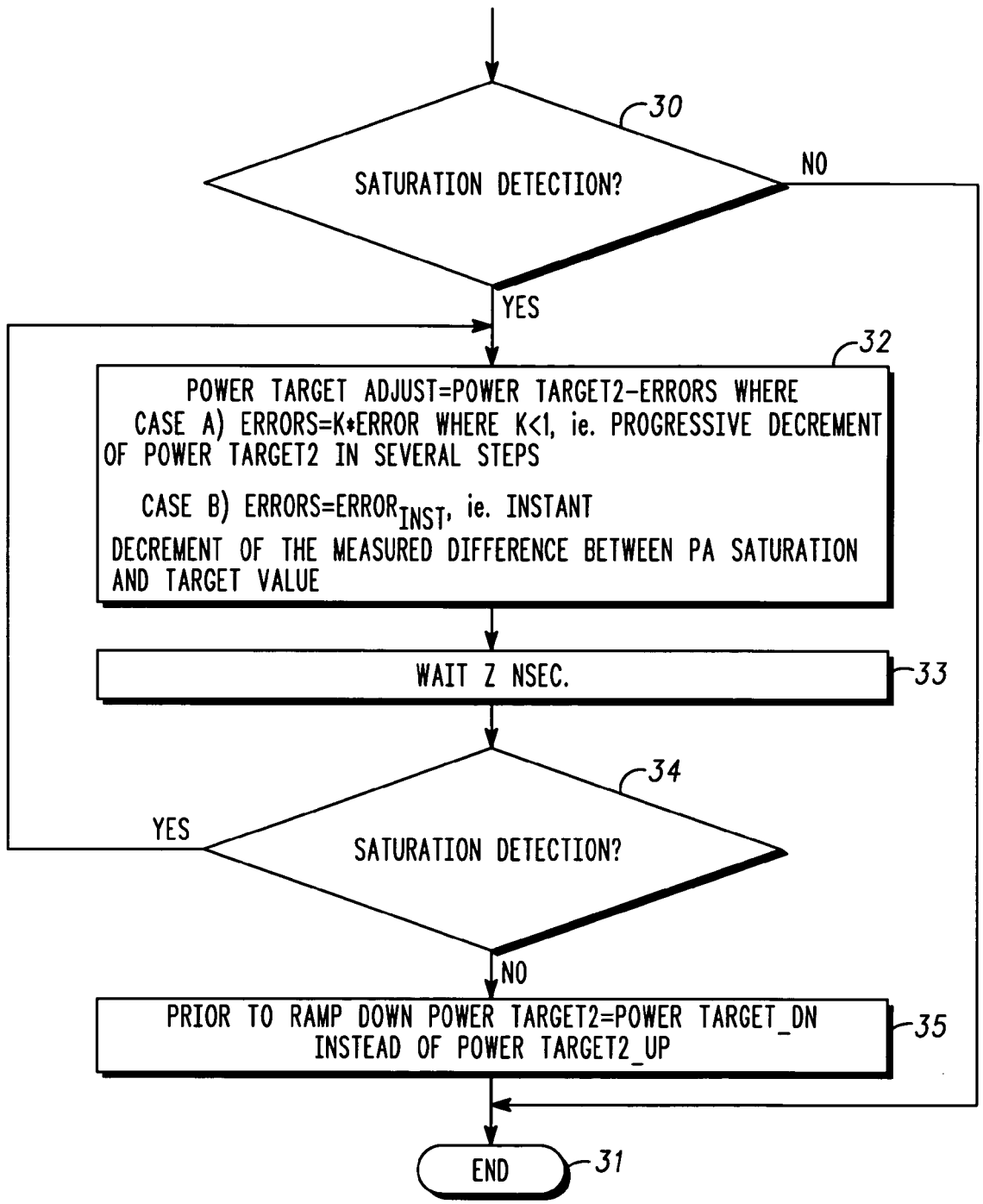

FIG. 1 shows a power amplifier system generally of the kind disclosed in U.S. Pat. No. 5,278,994. This amplifier system is shown as used in a cellular telephone handset for the GSM, Digital Cellular Systems ("DCS"), and Personal Communications Services ("PCS") systems although such an amplifier is also usable in other applications. The voltage supply Vbat for the power amplifier 1 comes from a rechargeable battery and the output of the power amplifier 1 is supplied through a coupler 2, for example an electromagnetic coupler.

The coupler 2 couples the radio-frequency output signals into control feedback loops without causing excessive loss to the radio-frequency output signal.

The amplifier output signal is supplied through the coupler 2 to a power detector 3, which supplies a signal whose value is proportional to the output power to a negative input of an adder 4 in a power control feedback loop, the output of the adder 4 being supplied to an integrator 5. The integrator 5 may be an analogue or digital integrator. The output of the integrator 5 controls the gain of the power amplifier 1.

A first power target 8 is supplied through an adjustment circuit 7, the adjusted power target 10 being supplied to the positive input of the adder 4. It will be appreciated that the power target 8 is calculated in the handset to correspond to the power amplification requirements for transmission and reception of the radio-frequency signal.

The error signal from the adder 4 is integrated in the integrator 5 to control the power output of the amplifier 1 and is also supplied to a saturation detector 6 in a saturation control feedback loop. The saturation detector responds to a parameter indicating saturation. In this case, given by way of example, the parameter is the error signal from the adder 4 being maintained at a non-zero value which does not change significantly in time, since this indicates that the power amplifier 1 is no longer responding to the power control signal from the integrator 5. When the detector 6 detects saturation, it produces an adjustment signal 9 which is applied to the power target adjuster 7 so that the adjusted power target 10 is reduced compared to the first power target 8.

As mentioned above, the power detector 3 has characteristics that vary within tolerances defined by telephone production test equipment, among other production tolerances, and also its characteristics vary with temperature and the frequency of the RF signal. The maximum output power of the power amplifier 1 is accordingly designed at approximately 1 dB higher than the maximum power required by the telephone specifications in this known system.

An example of the operation of this system with specific assumptions as to the operating parameters is as follows:

It is assumed that the maximum power output capacity of the power amplifier 1 at the specification minimum value of the battery voltage supply Vbat (3.0V)=+30 dbm in DCS.

The first Power Target 8 at a particular slot is assumed to be +30 dbm.

It is also assumed that the response characteristics of the power detector 3 increase by +0.5 dB at high temperature, that is to say 60° C. or more compared to its nominal value at room temperature.

The Output Power as measured by the response of the power detector 3 is then +30 dbm+0.5 dB=30.5 dbm. In the absence of detection of saturation by the saturation detector 6, the adjusted power target 10 equals the first Power target 8=+30 dbm.

Accordingly, the error signal at the output of the adder 4 is negative and equal to −0.5 dbm, causing the closed power control feedback loop to adjust the power output of the amplifier 1 through the integrator 5 until the response of the detector 3 is equal to the adjusted power target 10, that is to say that the resulting output power of the power amplifier 1 is equal to +29.5 dbm and not the 30 dbm of the target 8. The result is also that the PA delivers less power than its capabilities by 0.5 dB.

To avoid this, one possibility would be adjust the +30 dbm first Power Target by increasing it by 0.5 dB to +30.5 dbm, so that in the event of variance of the power detector response characteristics by +0.5 dB due to high temperature, for example, the PA output power will be at +30 dbm.

However in the event of negative variance of the power detector response characteristics by −0.5 dB, due to low temperature, for example, are −0.5 dB, for the same first power target 8 of +30.5 dbm, the output power of the amplifier 1 would have to go to +30.5 dbm+0.5 dB=+31 dbm. However, since the PA max power is limited to +30 dbm, the power amplifier 1 will saturate and, instead of the loop operating as closed loop, the amplifier output power will not follow the power target 10 and the loop will run in open mode. The response time during ramp down will be too slow in many cases, and a telephone incorporating the amplifier 1 will risk failing the time mask during ramp down.

To ensure that the power amplifier 1 reaches a power output of 30 dbm in response to a first power target of 30 dbm in all circumstances without saturating, the maximum output power capacity of the amplifier 1 would need to be +31 dBm instead of +30 dbm resulting in an impact on the integrated circuit size, with the semiconductor die size increasing by 40% (20% increase for 0.5 dB extra power), a reduction in efficiency, and an increase in the operating temperature junctions of the elements of the semiconductor die of the power amplifier 1.

The saturation detector feedback loop acts to bring the amplifier 1 out of saturation again when the saturation detector 6 detects saturation by applying an adjustment signal 9 to the power target adjuster 7, generally as described in U.S. Pat. No. 5,278,994 but over-sizing the output power capacity of the amplifier 1 remains necessary to ensure the actual output power reaches the first power target in all circumstances.

In fact, the variance of the gain of the amplifier 1 itself is considerably smaller than that of the power detector and may typically be of the order of 0.15 dB to 0.2 dB, for example. The embodiment of the present invention shown in FIG. 2 utilises this fact to reduce or eliminate the necessity for over-sizing the power amplifier 1. The amplifier system shown in FIG. 2 includes a power target variation module 11 that responds to the level of the first power target 8 being close to a value corresponding to saturation of the power amplifier 1 by producing a modified power target 17 at the rising edge of the first power target 1 that is higher than the first power target 8 and which causes the power amplifier 1 to saturate. The saturation detection loop then reacts to adjust the modified power target 17 to avoid substantial saturation of the power amplifier 1 by adjusting the adjusted power target 10 to a level lower than the modified power target 17 but with the power amplifier 1 very close to its maximum power capability, which is independent of variation and tolerance of the characteristics of the power detector 3.

In more detail, the power target variation module 11 stores the maximum power levels that the power amplifier 1 is designed to achieve for different values of the battery supply voltage Vbat and different values of operating temperature, these values being measured and input to the module 11. In this embodiment of the invention, the maximum design power levels of the amplifier 1 are stored in the form of a look-up table.

When the module 11 detects a first power target 8 close to, or at, the maximum design power of the amplifier 1, it applies an offset to the first power target 8 sufficient to send the power amplifier 1 into saturation, the offset producing the modified power target 17.

Once the power target adjuster 7 has reacted to saturation and brought the power amplifier 1 out of substantial saturation again, the adjusted power target 10 is stored in a register 16 and the stored value 18 may then be used instead of the modified power target 17 during the rest of the slot or, indeed, over a period of several slots if a first power target 8 corresponding to saturation does not occur again in the meantime. The stored value 18 and the modified power target 17 are supplied to a multiplexer 15 and the stored value 18 is substituted for the modified target 17 once the initial phase of the power burst has terminated. The output 19 from the multiplexer 15 is supplied to a multiplier 14 and multiplied by a signal from a ramp shaper circuit 13 which shapes the leading and trailing edges of the power burst. During the leading edge, the power is ramped up by the ramp shaper circuit 13 applying a cosine function, which varies from zero to one, multiplying the modified power target 17 until the output level 12 of the multiplier 14 reaches the level of the modified power target 17. During the ramp-down phase, the stored power target 18 is multiplied by a cosine function which varies from one to zero so that the output 12 of the multiplier 14 reduces from the level of the stored value 18 to substantially zero. The variations of the different signals are depicted for an example of the operation of the amplifier system of FIG. 2 in FIG. 3. In this example, An example of the operation of the system of this embodiment of the invention with the same assumptions as to the operating parameters as the example given above is as follows:

When the module 11 detects a first power target close to or at the saturation power of the amplifier 1, it adds an offset of +1 dB such that the modified power targets 17 and 12 are equal to the fist power target 1 plus the +Offset=+30 dbm+1 dB=+31 dbm. The offset of 1 dB is chosen to be sufficient to ensure saturation of the amplifier 1 but a bigger offset of 2 or 3 dB, for example could be used as long the offset ensures triggering the saturation compensation mechanism of the detector 6.

Assuming, as before that the maximum output power capacity of the amplifier 1 is equal to +30 dbm, if the variance of the response characteristics of the detector 3 is +0.5 dB, the output of the detector 3 is equivalent to a detected power of +30 dbm+0.5 dB=+30.5 dbm.

Then the error signal from the adder 4 is positive by +0.5 dB and the power amplifier 1 is saturated since its cannot deliver more than +30 dbm at the given battery supply and temperature conditions.

The saturation detector 6 detects the saturation and applies the adjustment value 9 to the power target adjuster 7. This reduces the adjusted power target 10 from +31 dbm to +30.5 dbm, when the adjusted power target 10 equals the the output of power detector 3 which stays constant during this time. The adjusted power target 10 is then maintained at +30.5 dbm, and the output power of the power amplifier 1 remains equal to +30 dbm since the control from the integrator is maintained during this reference adjustment as the error signal from the adder 4 is zero. This operation is summarised in the following table:

power equal to its maximum capability, +30 dbm in this example for the current battery conditions and temperature, and then the saturation mechanism adjusts only the reference 10 of the closed power control loop, not the actual output power of the amplifier 1, setting the adjusted power target 10 equal to the feedback from the power detector 3 such when ramp down occurs, the amplifier output power immediately starts to ramp down from its maximum value.

Ramp up and down shaping is applied to the modified power target 17 by a signal from the ramp shaper circuit 13 applied to the multiplier 14 and is passed on to the adder of the power control loop.

During the ramp up phase of the burst, the modified power target 17 is multiplied by a RAMP UP signal which varies from 0 to 1 as a rising cosine function to produce the power target 12, then the target from the power target adjuster 10 will follow the target 12 until the saturation mechanism is triggered when the RAMP UP signal is close to or equal to 1, at the end of the ramp up burst; the final ramp up value of the power target is then reduced to +30.5 dbm in this example to bring the power amplifier 1 back out of significant saturation.

At the end of the burst, when ramp down needs to occurs, the modified power target 17 is multiplied by a RAMP DN signal which varies from 1 to 0 as a falling cosine function to produce the power target 12; the target from the power target adjuster 10 will follow the target 12 down to 0, that is to say from +30.5 dbm to −50 dbm in this example.

The operation of the feedback control loops in FIG. 2 is shown in more detail in the flowcharts of FIGS. 4 and 5. At the start of a slot, at 20, the power target variation module 11 in a detection step 21 detects whether the first power target 8 is greater than the stored maximum design power of the amplifier 1, whether the voltage supply Vbat for the power amplifier 1 is less than a critical threshold, and whether the operating temperature is greater than a critical threshold.

If any of these conditions are met, the power target variation module 11 acts in a step 22 to apply an offset to the first power target 8 such that the modified power target 17 is greater than the maximum power capacity of the power amplifier 1, the modified target 17 being a function of the

|  | Power target1 (8) | Power target2 (17) | Adjusted Power target (7) | Adjust signal (9) | PA output |
|---|---|---|---|---|---|
| Initial Saturation phase (before detection of saturation and adjustment) | 30 dB | 30 dB + 1 dB = 31 dB | 31 dB | 31 dB − 30.5 dB = 0.5 dB | 30 dB |
| Phase 2 (after adjustment and saturation detection) | 30 dB | 31 dB + 1 = 31 dB, stays constant | 31 dB − Error = 31 dB − 0.5 dB = 30.5 dB | 0 dB | 30 dB |

The intervention of the power target variation module 11, together with the saturation compensation action of the saturation detector 6 has resulted in getting the power amplifier 1 to deliver its maximum output power capacity, +30 dbm, in spite of the inaccuracy introduced by the tolerances and variability of the response characteristics of the power detector 3. Since the adjusted power target 10 has been reduced to +30.5 dbm to equal the feedback from the power detector 3, correcting for the inaccuracy of +0.5 dB in the detector, the amplifier 1 is not maintained significantly saturated and ramp down can occur correctly.

In summary, the power amplifier 1 is pushed at the end of the initial ramp up phase of the power burst to an output voltage supply Vbat and the operating temperature. The saturation control loop then acts in a step 23 to bring the power amplifier back out of saturation.

If, on the other hand, none of the criteria of the detection step 21 were met, the operation of the power target variation module 11 passes directly to the step 23, where the saturation detection loop allows the power target signal 12 to pass without adjustment, since the power amplifier 1 is not in fact saturated. In the step 24, the adjusted power target 10 applied to the adder 4 of the power control loop, which is independent of the manufacturing tolerances and variations in operating conditions of the power detector 3, is stored in the register 16 and the algorithm ends at 25.

The operation at step 23 of the saturation control loop is shown for an embodiment of the present invention in FIG. 5. In a step 30, the saturation detector 6 detects whether saturation is occurring and, if not, the remainder of the algorithm is bypassed, the operation going directly to the end 31. If saturation is detected, the adjusted power target 10 is reduced relative to the power target 12 in the power target adjuster 7 at a step 32.

In one embodiment of the present invention, similar to the operation described in U.S. Pat. No. 5,278,994, the adjustment signal 9 applied to the power target adjuster 7 has a value ErrorS which is a proportional to the detected error at the output of the adder 4 by a factor less than one. The saturation detector 6 then pauses for a period of Z seconds in a step 33 and in a step 34, the saturation detector 6 then detects again whether saturation of the power amplifier 1 is occurring. If saturation is still occurring, the process reverts to the step 32 and a further decrement proportional to the error signal from the output of the adder 4 is applied to the power target adjuster 7. This loop continues until the power amplifier 1 is no longer saturated, the iterations of the loop being sufficiently rapid that the saturation of the power amplifier 1 lasts only a short period at the start of the time slot.

In another embodiment of the present invention, particularly applicable where the control loops are digital, the adjustment signal 9 applied to the power target adjuster 7 has a value ErrorS equal to the instantaneous error signal at the output of the adder 4 so that, in principle, the power target adjuster 7 sets the value of the adjusted power target 10 to a level where the amplifier 1 is just not saturated in a single adjustment. However, one or more iterations may still occur in practice through the steps 33 and 34. This embodiment of the invention is depicted in FIG. 3.

Once the power amplifier 1 is brought back out of saturation as detected in the step 34, the stored adjusted power target 18 is substituted for the power target 17 from the module 11, at latest prior to ramp-down of the power at the end of the slot, in a step 35.

It will be appreciated that the maximum power specification may now be met with a power amplifier that is not oversized to take account of the power test tolerances at the telephone manufacturer and of the manufacturing tolerances and operational variance of the detector 3, since the maximum design output power of the power amplifier 1 defines the actual output power achieved in response to a call from the first power target 8 for maximum output power.

The invention claimed is:

1. Power amplifier apparatus comprising power amplifier means having a signal output, and control means responsive to the power of an output signal at said output for controlling said output signal power relative to a first power target signal and additionally responsive to a parameter indicative of saturation of said power amplifier means for adjusting said output signal power to a level at which said power amplifier means is substantially not saturated, and power target variation means operable at least when said first power target signal is close to a value corresponding to saturation of said power amplifier means for at least initially applying to said control means a modified power target signal corresponding to a power target higher than said first power target signal and at which said power amplifier means saturates, said modified power target signal causing said control means to react to saturation of said power amplifier means adjusting said output signal power to a level at which said power amplifier means operates substantially at its maximum power but not saturated.

2. Power amplifier apparatus as claimed in claim 1, wherein said power target variation means is initially responsive to said first power target signal being close to said value corresponding to saturation for applying said modified power target signal to said control means said control means reacting to saturation of said power amplifier means by producing a first adjusted power target signal controlling said output signal power, said power target variation means being subsequently responsive to said first adjusted power target signal for applying a second adjusted power target signal to said control means so as to maintain said output signal power at a level such that said power amplifier means operates substantially at its maximum power but is substantially not saturated.

3. Power amplifier apparatus as claimed in claim 2, wherein said power target variation means comprises means for storing said first adjusted power target signal and applying the stored signal to said control means so as to control said output signal power to a level such that said power amplifier means is substantially not saturated.

4. Power amplifier apparatus as claimed in claim 1, wherein said power target variation means comprises means for causing said output signal power to increase and decrease progressively at the start and finish of an amplification period.

5. Power amplifier apparatus as claimed in claim 1, wherein said power target variation means is arranged to store maximum design power levels of said power amplifier means and is responsive to said first power target signal relative to said stored levels, whereby said power target variation means is selectively operative to apply said modified power target signal when said first power target signal is close to a value corresponding to saturation of said power amplifier means.

6. Power amplifier apparatus as claimed in claim 5, wherein said power target variation means is arranged to store said maximum design power levels of said power amplifier means as a function of its operating parameters and is responsive to actual operating parameters of said power amplifier means for selecting a corresponding stored maximum power level.

7. Power amplifier apparatus as claimed in claim 6, wherein said operating parameters include operating temperature and battery charge.

8. Power amplifier apparatus comprising power amplifier circuit having a signal output, and control circuit responsive to the power of an output signal at said output for controlling said output signal power relative to a first power target signal and additionally responsive to a parameter indicative of saturation of said power amplifier circuit for adjusting said output signal power to a level at which said power amplifier circuit is substantially not saturated, and power target variation circuit operable at least when said first power target signal is close to a value corresponding to saturation of said power amplifier circuit for at least initially applying to said control circuit a modified power target signal corresponding to a power target higher than said first power target signal and at which said power amplifier circuit saturates, said modified power target signal causing said control circuit to react to saturation of said power amplifier circuit adjusting said output signal power to a level at which said power amplifier circuit operates substantially at its maximum power but not saturated.

9. Power amplifier apparatus as claimed in claim 8, wherein said power target variation circuit is initially responsive to said first power target signal being close to said value corresponding to saturation for applying said modified power target signal to said control circuit said control circuit reacting to saturation of said power amplifier circuit by producing a first adjusted power target signal controlling said output signal power, said power target variation circuit being subsequently responsive to said first adjusted power target signal for applying a second adjusted power target signal to said control circuit so as to maintain said output signal power at a level such that said power amplifier circuit operates substantially at its maximum power but is substantially not saturated.

10. Power amplifier apparatus as claimed in claim 9, wherein said power target variation circuit comprises circuit for storing said first adjusted power target signal and applying the stored signal to said control circuit so as to control said output signal power to a level such that said power amplifier circuit is substantially not saturated.

11. Power amplifier apparatus as claimed in claim 8, wherein said power target variation circuit comprises circuit for causing said output signal power to increase and decrease progressively at the start and finish of an amplification period.

12. Power amplifier apparatus as claimed in claim 8, wherein said power target variation circuit is arranged to store maximum design power levels of said power amplifier circuit and is responsive to said first power target signal relative to said stored levels, whereby said power target variation circuit is selectively operative to apply said modified power target signal when said first power target signal is close to a value corresponding to saturation of said power amplifier circuit.

13. Power amplifier apparatus as claimed in claim 12, wherein said power target variation circuit is arranged to store said maximum design power levels of said power amplifier circuit as a function of its operating parameters and is responsive to actual operating parameters of said power amplifier circuit for selecting a corresponding stored maximum power level.

14. Power amplifier apparatus as claimed in claim 13, wherein said operating parameters include operating temperature and battery charge.

* * * * *